(12) United States Patent
Cheon

(10) Patent No.: US 9,911,467 B2
(45) Date of Patent: Mar. 6, 2018

(54) RESISTANCE VARIABLE MEMORY APPARATUS AND OPERATING METHOD THEREOF

(71) Applicant: SK hynix Inc., Icheon-si, Gyeonggi-do (KR)

(72) Inventor: Jun Ho Cheon, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/275,732

(22) Filed: Sep. 26, 2016

(65) Prior Publication Data
US 2017/0345466 A1    Nov. 30, 2017

(30) Foreign Application Priority Data

May 24, 2016   (KR) ......................... 10-2016-0063488

(51) Int. Cl.
*G11C 7/10*   (2006.01)

(52) U.S. Cl.
CPC .......... *G11C 7/1006* (2013.01); *G11C 7/1045* (2013.01)

(58) Field of Classification Search
CPC ............................ G11C 7/1006; G11C 7/1045
See application file for complete search history.

(56) References Cited

U.S. PATENT DOCUMENTS

| | | | | |
|---|---|---|---|---|
| 7,463,546 B2* | 12/2008 | Fasoli | ...................... | G11C 8/08 365/148 |
| 2008/0310215 A1* | 12/2008 | Ueda | ...................... | G11C 11/16 365/158 |
| 2008/0310218 A1* | 12/2008 | Hachino | .................. | G11C 11/15 365/171 |
| 2010/0271885 A1* | 10/2010 | Scheuerlein | ........... | G11C 5/025 365/189.09 |
| 2011/0280057 A1* | 11/2011 | Kim | ...................... | G11C 29/02 365/148 |
| 2012/0250401 A1* | 10/2012 | Storms | ............... | G11C 13/0004 365/163 |
| 2014/0244931 A1* | 8/2014 | Kim | .................... | G11C 13/0069 711/118 |
| 2016/0118117 A1* | 4/2016 | Park | .................... | G11C 13/0069 365/148 |
| 2016/0293252 A1* | 10/2016 | Ogiwara | ............ | G11C 13/0004 |

FOREIGN PATENT DOCUMENTS

KR   10-0790043 B1   12/2007
KR   1020080089319 A   10/2008

* cited by examiner

*Primary Examiner* — Khamdan Alrobaie
(74) *Attorney, Agent, or Firm* — William Park & Associates Ltd.

(57) ABSTRACT

A resistance variable memory apparatus may include a memory cell array and a controller. The memory cell array may include a plurality of resistance variable memory cells. The controller may control a current path flowing through any one memory cell and a current path flowing through the other memory cell to be formed differently from each other in response to at least two address signals.

7 Claims, 2 Drawing Sheets

RESISTANCE VARIABLE MEMORY APPARATUS AND OPERATING METHOD THEREOF

CROSS-REFERENCES TO RELATED APPLICATION

This application claims priority under 35 U.S.C. 119(a) to Korean application No. 10-2016-0063488 filed on May 24, 2016, in the Korean intellectual property Office, which is incorporated by reference in its entirety.

BACKGROUND

1. Technical Field

Various embodiments generally relate to a semiconductor integrated circuit device, and more particularly to a resistance variable memory apparatus and an operating method thereof.

2. Related Art

Resistance variable memory apparatuses are a type of memory that stores data by varying a resistance state of a data storage material according to an applied current or voltage level.

The resistance variable memory apparatuses operate at a faster speed than flash memory apparatuses. In addition, the resistance variable memory apparatuses have a lower production cost and a longer lifespan than the flash memory apparatuses.

There have been considerable efforts in recent years to improve integration density of the resistance variable memory apparatus. As a result various memory cell structures have been proposed. Examples of the memory cell structures include a stacking structure, which is formed by stacking a plurality of memory cells vertically, and a cross point structure in which a plurality of lower electrodes and a plurality of upper electrodes cross each other and memory nodes are formed at each crossing point.

For a high-speed operation of the resistance variable memory apparatus, the number of memory cells that can be simultaneously accessed has to be as large as possible. In addition, to guarantee a reliable operation, a bias having a preset level may be necessarily applied to the memory cells simultaneously accessed.

SUMMARY

According to an embodiment, a resistance variable memory apparatus may include a memory cell array and a controller. The memory cell array may include a plurality of resistance variable memory cells. The controller may control a current path flowing through any one memory cell and a current path flowing through the other memory cell to be formed differently from each other in response to at least two address signals.

According to an embodiment, a resistance variable memory apparatus may include a memory cell array, a row-side write control circuit, a first switching circuit, a read/write circuit, a second switching circuit, and a controller. The memory cell array may include a plurality of resistance variable memory cells coupled between a plurality of word lines and a plurality of bit lines. The row-side write control circuit may include a first write driver and a first current sink circuit. The first switching circuit may control a connection path between the row-side write control circuit and the plurality of word lines. The read/write circuit may include a second write driver and a second current sink circuit. The second switching circuit may control an electrical connection path between the read/write circuit and the plurality of bit lines. The controller may control the first switching circuit and the second switching circuit to control an electrical connection path between the row-side write control circuit and the read/write circuit via a plurality of memory cells corresponding to a plurality of address signals in response to the plurality of address signals.

According to an embodiment, there is provided an operating method of a resistance variable memory apparatus which includes a memory cell array including a plurality of resistance variable memory cells and a controller. The method may include programming memory cells by writing data in the memory cells in a way that controls a current path flowing through any one memory cell of the memory cells and a current path flowing through the other memory cell to be formed differently from each other by the controller in response to at least two address signals.

These and other features, aspects, and embodiments are described below in the section entitled "DETAILED DESCRIPTION".

BRIEF DESCRIPTION OF THE DRAWINGS

The above and other aspects, features and advantages of the subject matter of the present disclosure will be more clearly understood from the following detailed description taken in conjunction with the accompanying drawings, in which.

DETAILED DESCRIPTION

Figure 1:
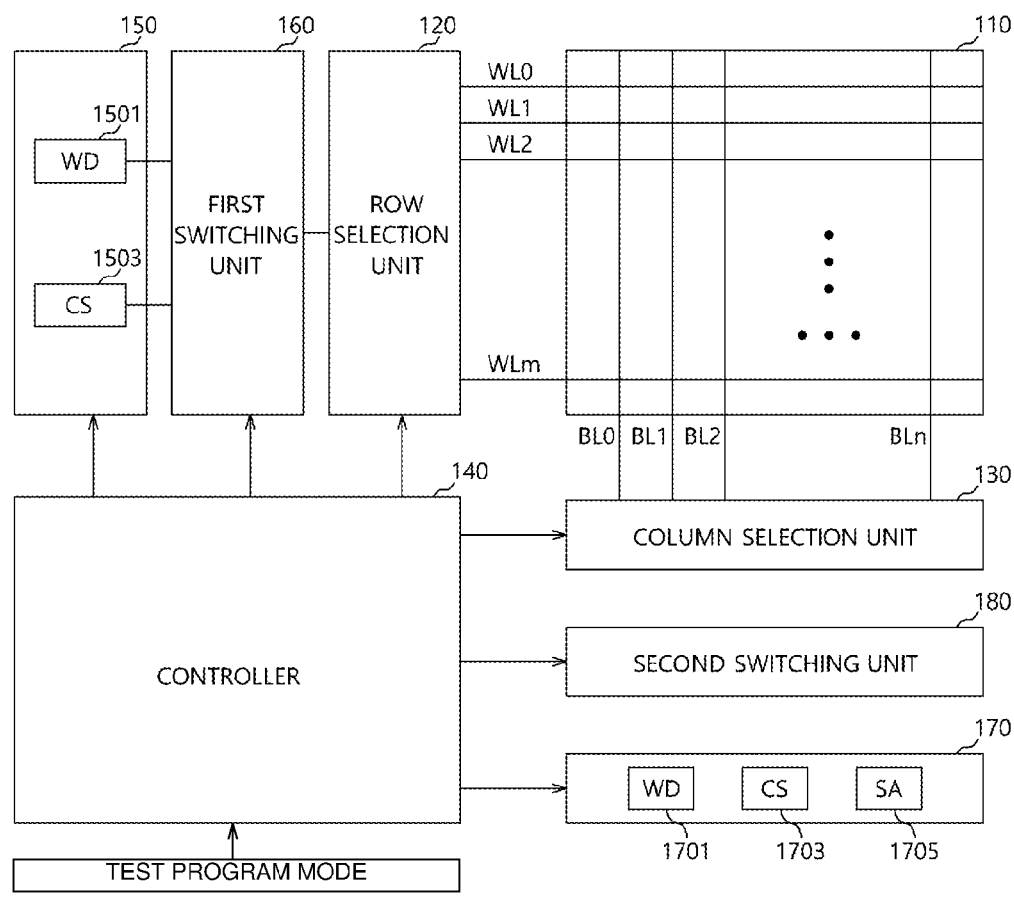
FIG. 1 is a diagram illustrating an example of a resistance variable memory apparatus according to an embodiment.

Example embodiments will be described in greater detail with reference to the accompanying drawings. Example embodiments are described herein with reference to cross-sectional illustrations that are schematic illustrations of example embodiments (and intermediate structures). As such, variations from the shapes of the illustrations as a result, for example, of manufacturing techniques and/or tolerances, are to be expected. Thus, embodiments should not be construed as limited to the particular shapes illustrated herein but may include deviations in shapes that result, for example, from manufacturing. In the drawings, lengths and sizes of layers and regions may be exaggerated for clarity. Like reference numerals in the drawings denote like elements. It is also to be understood that when a layer is referred to as being "on" another layer or substrate, it can be directly on the other or substrate, or intervening layers may also be present. It is also noted that in this specification, "connected/coupled" refers to one component not only directly coupling another component but also indirectly coupling another component through an intermediate component. In addition, a singular form may include a plural form, and vice versa as long as it is not specifically mentioned.

The inventive concept is described herein with reference to cross-section and/or plan illustrations of idealized embodiments of the inventive concept. However, embodiments of the inventive concept should not be construed as limiting the inventive concept. Although a few embodiments of the inventive concept will be shown and described, it will be appreciated by those of ordinary skill in the art that changes may be made in these example embodiments without departing from the principles and spirit of the inventive concept.

FIG. 1 is a diagram illustrating an example of a resistance variable memory apparatus according to an embodiment.

Referring to FIG. 1, a resistance variable memory apparatus 10 according to an embodiment may include a memory cell 110, a row selection circuit 120, a column selection circuit 130, a controller 140, a row-side write control circuit 150, a first switching circuit 160, a read/write circuit 170, and a second switching circuit 180.

The memory cell array 110 may include a plurality memory cells coupled between a plurality of bit lines BL0 to BLn and a plurality of word lines WL0 to WLm. Each of the plurality of memory cells may include, for example, a selection element and a data storage element. Example structures of the memory cell array 110 may include a single-layer array structure, a multi-layer array structure, and a cross point array structure.

The row selection circuit 120 may select a word line corresponding to a row address signal by decoding the row address signal provided from an external device.

The column selection circuit 130 may select a bit line corresponding to a column address signal by decoding the column address signal provided from the external device.

In an embodiment, at least two address signals may be provided in a test program mode, and each of the address signals may include a row address and a column address.

The controller 140 may control an overall operation of the resistance variable memory apparatus 10.

The row-side write control circuit 150 may include a first write driver (WD) 1501 and a first current sink circuit (CS) 1503. The first write driver 1501 may supply a program voltage to a word line selected in the test program mode. For example, the first write driver 1501 may provide an electric current for programming a memory cell. The first current sink circuit 1503 may allow an electric current to flow from a word line selected in the test program mode.

The first switching circuit 160 may control an electrical connection path between the row-side write control circuit 150 (e.g., the first write driver 1501 and the first current sink circuit 1503 of the row-side write control circuit 150) and the row selection circuit 120 according to control signals of the controller 140 in the test program mode.

The read/write circuit 170 may include a second write driver (WD) 1701, a second current sink circuit (CS) 1703, and a read circuit (SA) 1705. The second write driver 1701 may supply a program voltage to a bit line selected in the test program mode. For example, the second write driver 1701 may provide an electric current for programming a memory cell. The second current sink circuit 1703 may allow an electric current to flow from a bit line selected in the test program mode. The read circuit 1705 may read out data from a memory cell selected in a normal mode or in a test mode by detecting voltage levels or electric current levels of the data signals read out from the memory cell.

The second switching circuit 180 may control an electrical connection between the read/write control circuit 170 (e.g., the second write driver 1701 and the second current sink circuit 1703 of the read/write control circuit 170) and the column selection circuit 130 according to control signals of the controller 140 in the test program mode.

In an embodiment, as two address signals are provided in the test program mode, the controller 140 may control the first and second switching circuits 160 and 180 to couple a word line and a bit line to the first current sink circuit 1503 and the second write driver 1701, respectively. For example, where one of the two address signals includes a first row address and a first column address, the first switching circuit 160 may couple a word line corresponding to the first row address to the first current sink circuit 1503, and the second switching circuit 180 may couple a bit line corresponding to the first column address to the second write driver 1701. In addition, where the other of the two address signals includes a second row address and a second column address, the first switching circuit 160 may couple a word line corresponding to the second row address to the first write driver 1501, and the second switching circuit 180 may couple a bit line corresponding to the second column address to the second current sink circuit 1703.

To simultaneously write test data in two memory cells corresponding to two address signals, the controller 140 may form a current path from a first bit line to a first word line via a selected first memory cell by supplying a program voltage from the second write driver 1701 to a bit line (the first bit line) of the selected first memory cell and by coupling a word line (the first word line) of the first memory cell to the first current sink circuit 1503. The controller 140 may form a current path from a second word line to a second bit line via a selected second memory cell by supplying the program voltage from the first write driver 1501 to a word line (the second word line) of the selected second memory cell and by coupling a bit line (the second bit line) of the second memory cell to the second current sink circuit 1703.

In an embodiment, the two address signals provided in the test program mode may have different row and column addresses from each other. As a result, current paths for programming two different memory cells corresponding to the two different address signals may not overlap each other, and thus the programming current paths in accordance with an embodiment may prevent localized current concentration. Therefore, when preset program voltages are provided to the two different memory cells to simultaneously perform two different program operations, the programming current paths in accordance with an embodiment may prevent a voltage drop that may be caused by a localized current concentration.

The programming current paths in accordance with an embodiment may allow two or more memory cells to be tested at the same time. Accordingly, the overall test time may be minimized by maximizing the number of memory cells to be simultaneously programmed.

In an embodiment, the memory cell array 110 may include a plurality of mats. The test program operation in accordance with an embodiment may be performed on two or more memory cells at the same time even if the two or more memory cells are in the same mat as each other.

In an embodiment, non-selected word lines and non-selected bit lines may be biased to a middle level voltage, for example, to half a power supply voltage in the test program mode.

The memory cell array 110 may have a single-layer array structure, a multi-layer array structure, or a cross point array structure.

Figure 2:
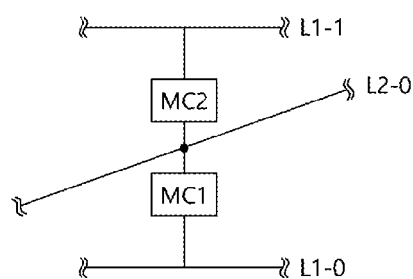
FIG. 2 is a diagram illustrating an example of a resistance variable memory cell array according to an embodiment.

FIG. 2 is a diagram illustrating an example of a resistance variable memory cell array according to an embodiment. In an embodiment, the resistance variable memory array may have the cross point array structure as illustrated in FIG. 2.

Referring to FIG. 2, the structure of a memory cell array 110-1 according to an embodiment may have a first memory cell MC1 coupled between a first lower-level interconnect L1-0 and a second interconnect L2-0, and a second memory cell MC2 coupled between the second interconnect L2-0 and a first upper-level interconnect L1-1.

In the embodiment, a first interconnect L1-$x$ may be a bit line and a second interconnect L2-$y$ may be a word line, but the scope of the first and second interconnects are not limited thereto.

Each of the memory cells MC1 and MC2 may have a structure such that a selection element and a data storage circuit are coupled in series to each other. Although not illustrated, the selection element may be selected from among various selection elements such as a vertical transistor, a diode, an ovonic threshold switching element. The data storage circuit may be formed of a material that changes its resistance value according to an amount of current applied thereto. For example, the data storage circuit may be formed using a phase-change material, but the material for the data storage circuit is not limited thereto.

Figure 3:
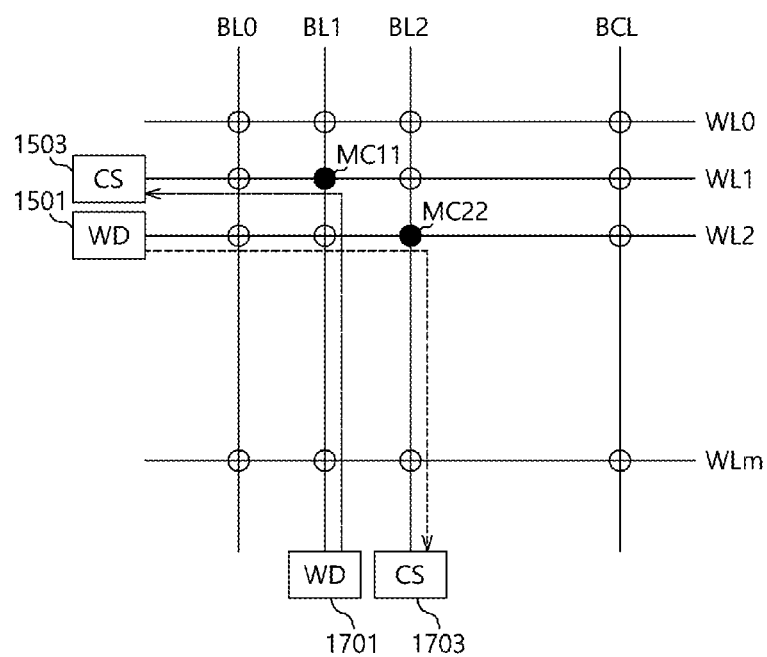
FIG. 3 is a diagram illustrating an example of an operating method of a resistance variable memory apparatus according to an embodiment.

FIG. 3 is a diagram illustrating an example of an operating method of a resistance variable memory apparatus according to an embodiment.

It is assumed that two address signals are applied in the test program mode. For example, a first address signal may be an address signal corresponding to a first bit line BL1 and a first word line WL1, and a second address signal may be an address signal corresponding to a second bit line BL2 and a second word line WL2.

For example, the controller 140 may control the second switching circuit 180 to couple the first bit line BL1 corresponding to the first address signal to the second write driver 1701, and may control the first switching circuit 160 to couple the first word line WL1 corresponding to the first address signal to the first current sink circuit 1503. The controller 140 may control the first switching circuit 160 to couple the second word line WL2 corresponding to the second address signal to the first write driver 1501, and may control the second switching circuit 180 to couple the second bit line BL2 corresponding to the second address signal to the second current sink circuit 1703.

In this example, with respect to a first memory cell MC11 corresponding to the first address signal, a current path may be formed from the first bit line BL1 to the first word line WL1 via the first memory cell MC11. In addition, with respect to a second memory cell MC22 corresponding to the second address signal, a current path may be formed from the second word line WL2 to the second bit line BL2 via the second memory cell MC22.

Accordingly, the current flow may be distributed without localized current concentration, and the test data may be simultaneously written in two memory cells MC11 and MC22.

Figure 4:
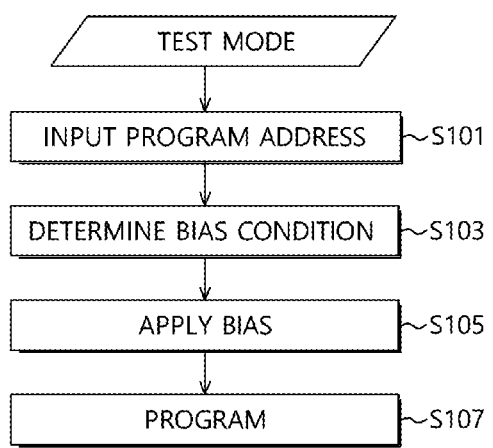
FIG. 4 is a flowchart illustrating an example of an operating method of a resistance variable memory apparatus according to an embodiment.

FIG. 4 is a flowchart illustrating an example of an operating method of a resistance variable memory apparatus according to an embodiment.

Example operations of a test mode may include various steps S101, S103, S105, and S107. In the step S101, an address signal for selecting a memory cell to be programmed may be provided. In an embodiment, the address signal may be provided to select two memory cells at the same time, but the invention is not limited thereto, and thus the address signal may be provided to select three or more memory cells. The address signal may have different row addresses and different column addresses from each other.

As an address signal is provided, the controller 140 may determine a bias condition with respect to word lines and bit lines coupled to the memory cells corresponding to the address signal (S103). The bias condition may be determined depending on whether to couple word lines and bit lines corresponding to two or more row and column addresses included in the address signal to the write driver or the current sink circuit. In an embodiment, the bias condition may be determined such that two different memory cells corresponding to two different address signals have different current paths from each other.

When the bias condition is determined, the controller 140 may apply the biases to the word lines and the bit lines in the step S105.

In an embodiment, where program operations are performed on two or more memory cells at the same time, the controller 140 may apply a program voltage to a first bit line coupled to a first memory cell by coupling the first bit line to the second write driver 1701, and may apply a ground voltage or a negative voltage to a first word line coupled to the first memory cell by coupling the first word line to the first current sink circuit 1503. In addition, the controller 140 may apply the program voltage to a second word line coupled to a second memory cell by coupling the second word line to the first write driver 1501, and may apply the ground voltage or the negative voltage to a second bit line coupled to the second memory cell by coupling the second bit line to the second current sink circuit 1703. The controller 140 may apply a middle level voltage to word lines and bit lines of non-selected memory cells.

When the biases are applied to the word lines and the bit lines, a program operation may be performed in the step S107. Test data may be simultaneously written in the selected two or more memory cells. In the test data program, the current paths for programming two or more memory cells may not overlap each other, and thus may prevent a program voltage drop that may be caused by a localized current concentration. Accordingly, a preset program current may be applied to the plurality of memory cells without the voltage drop. The test data may be simultaneously written in the plurality of memory cells, and the overall time may be reduced.

The above embodiment of the present invention is illustrative and not limitative. Various alternatives and equivalents are possible. The invention is not limited by the embodiments described herein. Nor is the invention limited to any specific type of semiconductor device. Other additions, subtractions, or modifications are obvious in view of the present disclosure and are intended to fall within the scope of the appended claims.

What is claimed is:

1. A resistance variable memory apparatus comprising:
a memory cell array including a plurality of resistance variable memory cells;
a controller configured to simultaneously control a current path flowing through any one memory cell and a current path flowing through the other memory cell to be formed differently from each other in response to at least two address signals, wherein the controller is configured to control so that a program voltage is applied to a selected word line in a test program mode, wherein the address signals have different column addresses and different row addresses from each other;

a row-side write control circuit including a first write driver and a first current sink circuit, wherein the row-side control circuit is coupled to a plurality of word lines; and a read/write circuit configured to include a second write driver and a second current sink circuit, wherein the read/write circuit is coupled to a plurality of bit lines.

2. The resistance variable memory apparatus of claim 1, wherein the at least two address signals are provided in the test program mode.

3. The resistance variable memory apparatus of claim 1, wherein the controller controls a current to flow from a first bit line toward a first word line to program the one memory cell coupled between the first bit line and the first word line, and controls a current to flow from a second word line toward a second bit line to program the other memory cell coupled between the second bit line and the second word line.

4. A resistance variable memory apparatus comprising:
a memory cell array including a plurality of resistance variable memory cells coupled between a plurality of word lines and a plurality of bit lines;
a row-side write control circuit including a first write driver and a first current sink circuit, wherein the first write driver is configured to provide a program voltage to a selected word line in a test program mode;
a first switching circuit configured to control a connection path between the row-side write control circuit and the plurality of word lines;
a read/write circuit configured to include a second write driver and a second current sink circuit;
a second switching circuit configured to control an electrical connection path between the read/write circuit and the plurality of bit lines; and
a controller configured to simultaneously control the first switching circuit and the second switching circuit to control an electrical connection path between the row-side write control circuit and the read/write circuit via a plurality of memory cells corresponding to a plurality of address signals in response to the plurality of address signals;

wherein the address signals include different column addresses and different row addresses from each other.

5. The resistance variable memory apparatus of claim 4, wherein the address signals are provided in the test program mode.

6. The resistance variable memory apparatus of claim 4, wherein the controller is configured to control a current path flowing through a memory cell corresponding to any one of the plurality of address signals and a current path flowing through a memory cell corresponding to the other of the plurality of address signals to be formed differently from each other.

7. The resistance variable memory apparatus of claim 4, wherein the controller is configured to control a bit line of a first memory cell corresponding to any one of the plurality of address signals to be coupled to the second write driver and control a word line of the first memory cell to be coupled to the first current sink circuit, and to control a bit line of a second memory cell corresponding to the other of the plurality of address signals to be coupled to the second current sink circuit and control a word line of the second memory cell to be coupled to the first write driver.

* * * * *